United States Patent
Crippen

(10) Patent No.: US 6,759,861 B2
(45) Date of Patent: Jul. 6, 2004

(54) THIN FILM PROBE CARD CONTACT DRIVE SYSTEM

(75) Inventor: Warren Stuart Crippen, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/208,900

(22) Filed: Jul. 30, 2002

(65) Prior Publication Data

US 2004/0021474 A1 Feb. 5, 2004

(51) Int. Cl.[7] .............................................. G01R 1/073
(52) U.S. Cl. ..................................... 324/757; 324/754
(58) Field of Search ................................ 324/754, 757, 324/758, 760, 761, 765

(56) References Cited

U.S. PATENT DOCUMENTS

| | | | | |
|---|---|---|---|---|
| 2,918,648 A | * | 12/1959 | Ludman et al. | 439/711 |
| 4,112,364 A | * | 9/1978 | Katz | 324/761 |
| 4,340,858 A | * | 7/1982 | Malloy | 324/761 |
| 5,825,192 A | * | 10/1998 | Hagihara | 324/757 |
| 5,926,029 A | * | 7/1999 | Ference et al. | 324/762 |
| 6,084,421 A | * | 7/2000 | Swart et al. | 324/755 |

* cited by examiner

Primary Examiner—Ernest Karlsen
(74) Attorney, Agent, or Firm—Schwegman, Lundberg, Woessner & Kluth, P.A.

(57) ABSTRACT

A probe card includes a flexible membrane, a plurality of probes attached to the flexible membrane, and a layer of foam connected to the flexible membrane so that when the probes are moved into the flexible membrane, the layer of foam is also deflected to produce a counteracting force at the probes. A plurality of push rods are used to transfer the force at the contacts to the foam layer. The foam layer is attached to a rigid plate or push plate. A guide plate includes openings through which the push rods pass. The guide plate supports the push rods along their length and reduces the spacing between the push rods at the flexible member when compared to the spacing of the push rods at the foam layer.

15 Claims, 4 Drawing Sheets

THIN FILM PROBE CARD CONTACT DRIVE SYSTEM

FIELD OF THE INVENTION

The present invention relates to an apparatus and method for providing electrical contacts. More specifically, the present invention relates to membrane probe cards used in making a large number of electrical components.

BACKGROUND OF THE INVENTION

As more and more capability is being designed into electronic components, such as microprocessors, the components are becoming increasingly complex. The more complex an electrical component becomes, the greater number of semiconductor device fabrication steps needed to form the electrical component. Semiconductor devices, such as microprocessors, are generally made from a wafer of semiconductive material. Many individual semiconductor devices are formed on a single wafer. All of the devices are made simultaneously on the wafer. Hundreds of individual semiconductor processes, which include deposition of material, ion implantation, etching, and photolithographic patterning, are conducted on a wafer to form a number of individual semiconductor devices. The wafers are sizeable. As a result, the effectiveness of each semiconductive process on each device may vary somewhat. In addition, each step or semiconductive process used to form the devices is not necessarily uniform. Generally, the semiconductive process has to perform within a desired range. The end result due to variations in the semiconductive processes as well as the variation in position is that the semiconductive devices formed may vary from one wafer to another. In addition, the semiconductive devices may vary from other semiconductive devices on the wafer.

The current practice is to test all the semiconductor devices on a wafer prior to singulation. Generally, two tests are conducted. The first test is conducted to determine if any of the individual semiconductive devices on the wafer are bad. A second test is conducted to determine a performance parameter for the good semiconductive devices on the wafer. For example, currently wafers have up to 300 microprocessors. Of course, the number of devices formed on a wafer will be higher in the future. Each of these microprocessors is tested to determine if the microprocessor is good. The speed of the microprocessor is determined in a second test. Once measured, the speed of the microprocessor is saved and the location of the microprocessor on the wafer is noted. This information is used to sort the microprocessors based on performance at the time the wafer is sliced and diced to form individual dies, each of which has a microprocessor thereon.

Each semiconductive device formed on a wafer has a number of electrical contacts. To test all the semiconductive devices on a wafer at once, many, if not all of the electrical contacts, have to be contacted. For example, testing a number of individual contacts on a wafer commonly requires upwards of 3000 different individual contacts to be made across the surface of the wafer. Testing each contact requires more than merely touching each electrical contact. An amount of force must be applied to a contact to break through any oxide layer that may have been formed on the surface of the contact. Forming 3000 contacts which are not all at the same height and not all in the same plane is also difficult. As a result, a force has to be applied to the contacts to assure good electrical contact and to compensate for the lack of planarity among the contacts.

FIG. 1 shows a membrane probe card 100 which is currently used to conduct high frequency sort and test procedures. The membrane probe card 100 includes a rigid substrate 110 and a plurality of probes 120. The probes 120 include an attached end 122 and a free end 124. The free end 124 of the probe 120 is used to contact an individual die 130. More specifically, the free end 124 of the probe 120 is used to contact individual electrical contacts 132 on the die 130. Only one die 130 is shown in FIG. 1. It should be noted that a wafer includes many dies that have not been sliced or diced into individual dies. The probe 120 includes a sharp bend 126 and also includes a more gentle bend 128. The more gentle bend 128 allows the probe 120 to act as a leaf spring. As shown in FIG. 1, the electrical contacts 132 of the die 130 have just come into contact with the individual probe 120 and specifically the free end 124 of the probe 120.

To overcome nonplanarity among the contacts 132 and to assure good electrical contact by passing through any oxidation layer on the contacts 132, the die is over driven into the rigid substrate 110. In other words, the die 130 or device under test is pressed into the probes 120 to assure that the each electrical contact 132 is contacted by a probe tip 124, and to assure that the oxidation layer has been punctured, so that good electrical contact is made. As shown by the phantom lines in FIG. 1, the device under test 130 is more closely spaced with respect to the substrate 110 so that the probes deflect and produce a larger force at the contacts 132.

The currently used membrane probe card system has a number of shortcomings. Among the shortcomings is the difficulty in controlling the amount of force produced by the probe tip. The amount of force produced at the probe tip 124 is related to the deflection of the spring shaped probe 120. If the planarity of the contacts 132 varies widely, the deflection of individual probes 120 also varies. In turn, the force at each probe tip 124 also varies widely and is difficult to control. Overdriving the probe cards not only causes variation in the force produced by the probe 120, but also causes damage to both the probe tip 124 and the product or device under test 130.

FIG. 2 shows a side view of a prior art membrane probe card 200. The membrane probe card includes a substrate 210 and a membrane 230. The membrane 230 is attached to the substrate 210. Attached to the membrane are a plurality of contacts 220. The contacts 220 are short and do not accommodate a lack of planarity. Any lack of planarity is accommodated by the membrane 230. Membrane probe card cards 200 also have shortcomings. The shortcomings include the fact that the membrane 230 may be damaged when the device under test is overdriven into the membrane probe card 200.

Thus, there is a need for a probe card which allows for force control at the probe tips so that the components of the probe card or the device under test are not damaged during testing. There is also a need for a probe card that has a more uniform or constant force at the probe tip.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

The description set out herein illustrates the various embodiments of the invention and such description is not intended to be construed as limiting in any manner.

DETAILED DESCRIPTION

Figure 1:
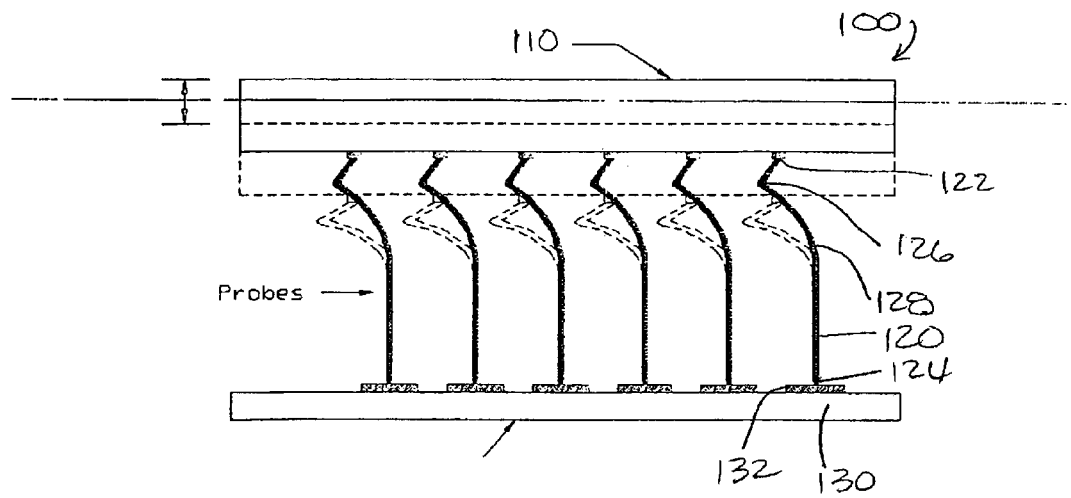
FIG. 1 illustrates a side view of a prior art probe card.
Figure 2:
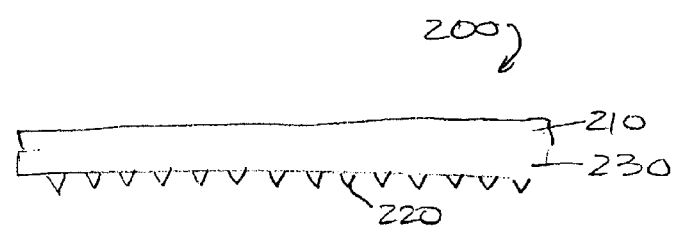
FIG. 2 illustrates a side view of a prior art membrane probe card.
Figure 3:
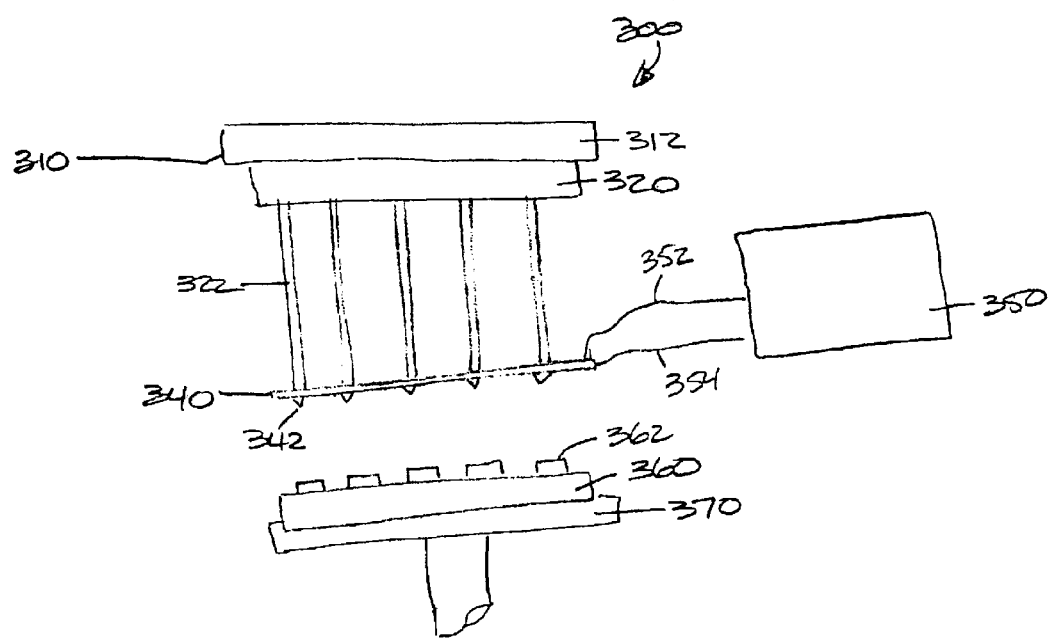
FIG. 3 illustrates a schematic view of a contactor which uses the thin film probe card contact drive system of this invention.

FIG. 3 illustrates a schematic view of a contactor which uses the thin film probe card contact drive system of this invention. The contactor 300 includes a contact drive system 310, a thin film substrate or flexible member 340 having contacts 342, and electrical circuitry 350. The electrical circuitry 350 will provide input to the contacts 342 on the thin film substrate or flexible member 340 and receives the output from the thin film substrate or flexible member 340 on line 354. The electrical circuitry 350 may include both the hardware and the software necessary to conduct tests on a device under a test 360.

The device under test 360 includes a set of electrical pads or contacts 362 which correspond to the contacts 342 on the flexible member or thin film substrate 340. The device under test 360 is mounted or attached to a driver 370. The driver 370 holds the device under test 360 and raises the device under test 360 until the electrical pads 362 contact the contacts 342 of the flexible member or thin film substrate 340. The thin film probe card contact drive system 310 includes a push plate 312 and a foam layer 320. A plurality of push rods 322 transfer the load at the flexible member or thin film substrate 340 to the foam pad 320. Typically there is a push rod 322 that corresponds to a position on the flexible member or thin film substrate 340 opposite a contact 342. The push rod 322 transfers force from the contact 342, or more specifically from the flexible member or thin film substrate 340 to the foam layer 320. The foam layer 320 is made of a foam having a close cell. The foam also has a high degree of elastic memory. The foam also has a specific durometer characteristic indicative of the elasticity and flexiblity of the foam layer 320. Typically, higher durometer readings indicate increased difficulty associated with pressing a push rod 322 into the layer of foam 320.

Figure 4:
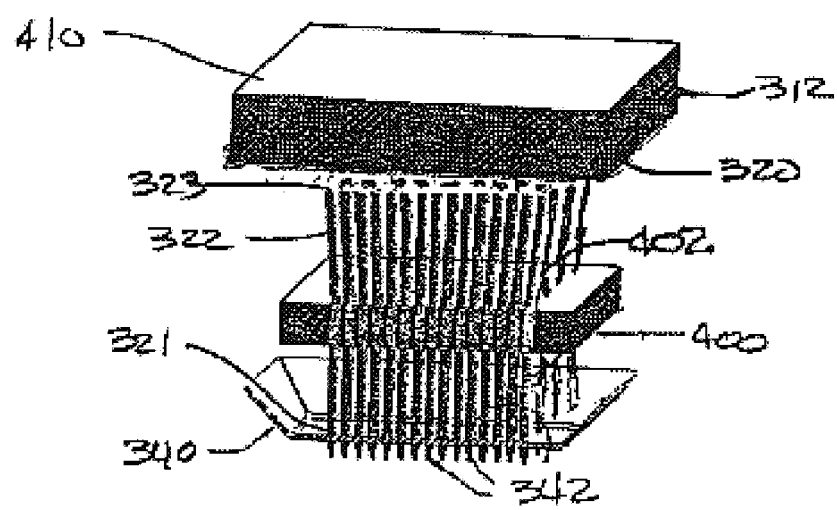
FIG. 4 illustrates an exploded side view of the thin film probe card contact drive system of this invention.

FIG. 4 illustrates an exploded side view of the thin film probe card contact drive system 410 of this invention. The thin film probe card contact drive system 410 includes a push plate 312. Attached to the push plate is a layer of foam 320. A series or plurality of push rods 322 are positioned to impact or press into the flexible member or thin film substrate 340. The push rods 322 include a first end 323 which contacts the foam pad 320, and a second end 321 which contacts a thin film substrate or flexible member 340. Attached to the thin film substrate or flexible member 340 are a set of probe tips 342. The probe tips 342 are attached on one side of the thin film substrate or flexible member 340. A push rod 322, or more specifically, the end 321 of the push rod 322, is typically positioned on the opposite side of the thin film substrate or flexible member 340 opposite from the probe tips 342.

A guide block 400 is positioned around the push rods 322. The guide block has openings 402 therein. The push rods 322 pass through the openings 402 in the guide block 400. The guide block 400 is made of a material that will allow the push rods 322 to slip within the openings 402 of the guide block 400. It should be noted that the pitch or spacing of the push rod ends 323 is farther apart than the spacing of the push rod ends 321 contacting or near the thin film substrate or flexible member 340. Thus, the guide block 400 serves several purposes, including supporting the column or push rod 322 to prevent columnar failure along the length of the push rod 322. Another purpose is to allow the pitch or spacing between the push rods 322 to be farther apart at the first end 323 contacting the layer of foam 320 than at the second end 321 where the push rod contacts flexible member or thin film substrate 340. When the spacing between the push rods 322 is increased, the amount of force applied to the push rod 322 can be more carefully controlled. In other words, with increased spacing between the push rods 322 at the first ends 323, the total area over which the push rods 322 act is effectively larger. Furthermore, the effect on the area where a first push rod 322 acts on the foam pad 320 is more isolated from the area where a second push rod (adjacent the first push rod) 322 acts. In other words, the foam pad 320 will act more independently to produce independent forces as the spacing between the first ends 323 of the push rods is increased. For a particular set of push rods 322, the pitch of the push rod 322 at the foam layer 320 is higher than the pitch the set of push rods at the thin substrate or flexible element 340. As shown in FIG. 4, the push rods 322 angle toward one another, or from the first end 323 to the second end 321 so that a device under test (shown in FIG. 3) having very closely spaced contacts can be tested. Since the spacing between the ends 323 of probes at the foam pad 320 is increased, an independent and controlled force is delivered to each and every contact or probe 342.

When a device under test (shown in FIG. 3) is placed in contact with the probes 342, the push rods 322 are compressed between the thin film substrate or flexible media 340 and the layer of foam 320. The layer of foam 320 and the push rods 322 serve as a backing to the individual contacts or probe tips 342 attached to the flexible membrane or thin film substrate 340. The amount of force produced at each probe tip 342 can be controlled by selecting different materials for the layer of foam 320. In addition, the spacing or pitch between the ends 323 of the push rods 322 is increased when compared to the pitch between the ends 321 of the push rods 322 at the thin film substrate or flexible member 340 so that the amount of force applied to one probe tip 342 is substantially independent of force applied to an adjacent probe tip 342. Typically the pitch between the first ends 323 of the push rods 322 will be higher, or the spacing between the ends 323 of the push rods 322 will be greater, at the foam layer 320 than the pitch between the second ends 321 of the push rods 322.

It should be noted that the push rods 322 form an array or geometric shape which corresponds to the array of probe tips 342. The array of probe tips 342 matches the array of contacts on the device under test (shown in FIG. 3). The array of first ends 323 of the push rods 322 formed at the foam layer 320 will have a spacing that is slightly greater then the array of the probe tips 342. For the sake of simplicity, a simple array having only two lines of push rods 322 is shown in FIG. 4. Generally, however, the array will and include additional push rod elements. Of course the actual geometric shape of the array of push rods 322 and the ends of the push rods is dependent on the shape of the array of contacts of the device under test (shown in FIG. 3).

Figures 5, 6:
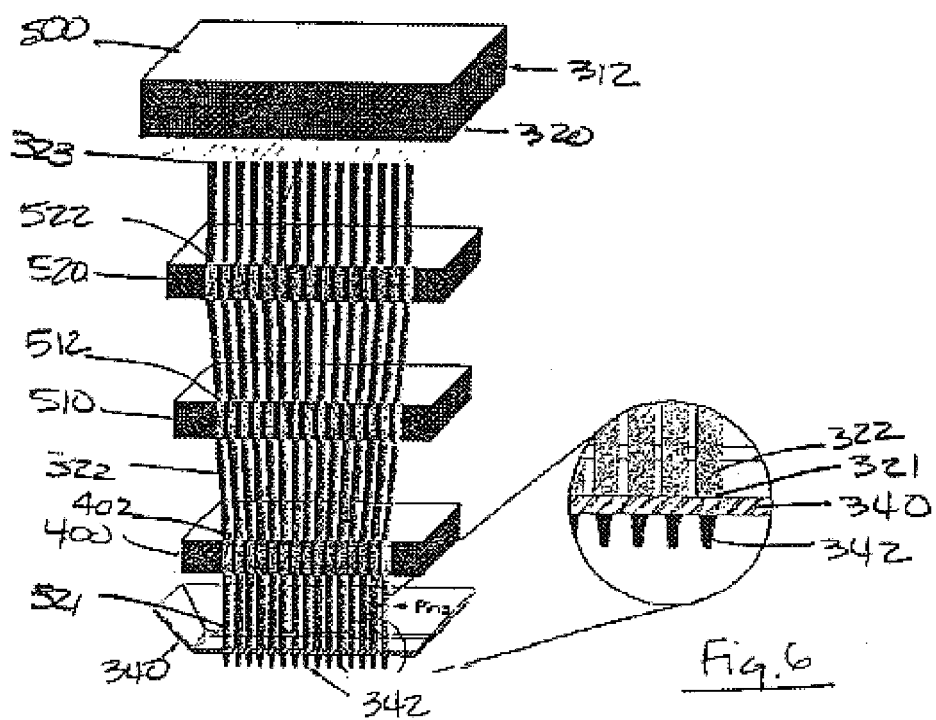
FIG. 5 illustrates an exploded side view of another embodiment of the thin film probe card contact drive system of this invention.
FIG. 6 illustrates a side view of the flexible membrane, the contacts and the push rods of the thin film probe card contact drive system of this invention.

FIG. 5 shows an exploded view of yet another embodiment of the thin film probe card contact drive system 500.

The main difference between the thin film probe card drive system 500 of FIG. 5 compared to the thin film probe card contact drive system 410 shown in FIG. 4, is the addition of a second guide plate or block 510 and a third guide plate or block 520. The guide plates 510 and 520 include openings 512 and 522, respectively. The push rods 322 shown in FIG. 5 are longer then the push rods 322 shown in FIG. 4. A push rod 322 will pass through an opening 402 in the first guide plate or guide block 400, an opening 512 in the second guide plate or guide block 510, and an opening 522 in the third guide block 520. At each guide block 400, 510, 520, the pitch between the individual push rods 322 increases as compared to the pitch between the probe tips 342. As a result, the pitch between the ends 323 contacting the foam pad or foam layer 320 is greater than the pitch between the push rods 322 between the second guide block 510 and the third guide block 520. Similarly the pitch between the second guide block 510 and the third guide block 520 is greater then the pitch between the first guide block 400 and the second guide block 510. The push rods are made of a material that can be compressed, such as epoxy, fiberglass or brass. Each of the guide blocks 400, 510, 520 is made of a material that will allow the guide or the push rods 322 to glide through the openings 402, 512, 522 within the respective guide blocks 400, 510, 520.

FIG. 6 illustrates a side view of the flexible membrane or thin film substrate 340 the contacts or probes 342 and the push rods 322. FIG. 6 shows a close up of these various components. FIG. 6 illustrates that for each contact 342 positioned on one side of the thin film substrate or flexible membrane 340, there is a push rod 322 placed on the opposite side of the thin film substrate 340. Specifically, the end 321 of the push rod 322 contacts one side of the thin film substrate 340 opposite a contact 342. The thin film substrate or flexible membrane 340 is sandwiched or positioned between the end 321 of the push rod 322 and the contact 342.

In operation, the device under test will come into contact with the individual pins 342. The thin film membrane 340 will compress slightly, but a force will be transferred to the push rod 322. The force is transferred up to the foam layer 320, which is selected so that a certain amount of pressure on the push plate 312 (shown in FIG. 5) would produce a selected amount of force in each of the contacts or probes 342. The push rod 322 is in compression between the contact 342 and the layer of foam 320 (shown in FIG. 5).

This structure has many advantages. The thin film probe card contact drive system allows for force control at the probe tips so that the components of the probe card are not damaged. The force control also prevents damage to the device under test. The force produced at the probe tips 342 by the thin film probe card contact drive system is also more uniform or constant. In other words, the force at each individual probe tip is closer to the force at other individual probe tips. The foam layer 320 provides for a more uniform force, since the foam is being compressed when the push rod pushes against the foam. The force produced at the probe tip 342 is controlled by selecting different types of foam. Foam typically has a durometer rating, which is a measure of the stiffness of the foam. A higher stiffness foam produces a higher force at the probe tip 342. The spacing of the push rods 322 at the foam 320 interface is controlled so that adjacent push rods 322 act independently or substantially independently of one another. The diameter of the push rods 322 at the foam 320 interface can also be changed to alter the amount of force at the probe tips 342. The spacing or the pitch is typically larger at the end 323 of the push rod 322 contacting the foam pad 320, so that the force can be dispersed over a larger area at the foam layer. The diameter of the push rods 322 at the foam layer 320 is also larger, so that the force can be dispersed over a larger area at the foam layer 320. Thus, a large force can be placed on the contact or probe tip 342 with little pressure on the rigid push plate 312 attached to the foam layer 320. Still a further advantage is that the membrane or thin film 340 associated with the probe card does not have to carry all the force necessary to place the probe tips 342 in contact with the contacts of the device under test. The result is a contact system which is more durable.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A contacter for making electrical contact with a device under test having a plurality of contacts, the contactor further comprising:

a flexible substrate having a first side and a second side;

a push plate remotely positioned from the flexible membrane;

a layer of foam attached to the push plate;

a plurality of contacts attached to one of the first side or the second side of the flexible substrate; and a plurality of push rods positioned near the plurality of contacts, the push rod having one end positioned on the side of the flexible member opposite the contact, and the other end of the push rod positioned near the layer of foam, such that placing a force on the contact compresses the push rod between the foam layer and a position near the contact.

2. The contactor of claim 1, further comprising a guide plate having a plurality of openings therein through which a corresponding plurality of push rods pass, the guide plate supporting the push rod along the length of the push rod.

3. The contactor of claim 1, further comprising a guide plate having a plurality of openings therein through which a corresponding plurality of push rods pass, the guide plate supporting the push rod along the length of the push rod, the plurality of push rods having a first spacing on one side of the guide plate and having a second spacing on the other side of the guide plate.

4. The contactor of claim 3, wherein the spacing of the push rods at the end contacting the foam layer is farther apart than the spacing of the push rods at the end near the contacts.

5. The contactor of claim 3, wherein the spacing of the surface area of the end of the push rods contacting the foam layer is larger than the surface area of the push rods at the end near the contacts.

6. The contactor of claim 1, wherein the spacing of the push rods at the end contacting the foam layer is farther apart than the spacing of the push rods at the end near the contacts.

7. The contactor of claim 2, wherein the spacing of the push rods at the guide plates is farther apart than the spacing of the push rods near the flexible substrate.

8. The contactor of claim 1, wherein the push plate is rigid.

9. The contactor of claim 1, wherein the push plate is formed of a rigid material.

10. The contactor of claim 1, wherein the push plate is formed of a material more rigid than the flexible member.

11. The contactor of claim 1, wherein the plurality of contacts are probe tips.

12. The contactor of claim 1, further comprising a device under test having a plurality of electrical pads in a pattern, wherein the plurality of contacts are in a pattern corresponding to the pattern of the electrical pads of the device under test.

13. The contactor of claim 1, further comprising a device under test having a plurality of electrical pads, wherein at least some of the plurality of pads have a single contact in communication with a single electrical pad of the plurality of electrical pads.

14. The contactor of claim 1, further comprising a guide plate having a plurality of openings therein, at least some of the openings in the guideplate supporting a push rod.

15. The contactor of claim 1, further comprising a guide plate having a plurality of openings for supporting at least two push rods.

* * * * *